(12) United States Patent
Nakayama et al.

(10) Patent No.: US 11,912,099 B2
(45) Date of Patent: Feb. 27, 2024

(54) MOVING BODY

(71) Applicant: HONDA MOTOR CO., LTD., Tokyo (JP)

(72) Inventors: Shingo Nakayama, Tokyo (JP); Akinori Myoi, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 431 days.

(21) Appl. No.: 17/403,145

(22) Filed: Aug. 16, 2021

(65) Prior Publication Data
US 2022/0068049 A1   Mar. 3, 2022

(30) Foreign Application Priority Data

Aug. 27, 2020 (JP) .................................. 2020-143969

(51) Int. Cl.
| | |
|---|---|
| *F24F 13/20* | (2006.01) |
| *B60H 1/00* | (2006.01) |
| *G07C 5/02* | (2006.01) |
| *B60R 11/04* | (2006.01) |
| *H05K 7/20* | (2006.01) |
| *B60R 13/02* | (2006.01) |

(Continued)

(52) U.S. Cl.
CPC ..... *B60H 1/00271* (2013.01); *B60H 1/00564* (2013.01); *B60Q 1/507* (2022.05); *B60Q 1/5037* (2022.05); *B60Q 1/543* (2022.05); *B60Q 1/547* (2022.05); *B60R 11/04* (2013.01); *B60R 13/02* (2013.01); *G07C 5/02* (2013.01); *H05K 7/20136* (2013.01); *B60R 2011/0026* (2013.01); *B60R 2013/0287* (2013.01); *G05D 1/0231* (2013.01); *G05D 1/0257* (2013.01)

(58) Field of Classification Search
CPC ........ G07C 5/02; B60H 1/00564; B60Q 1/50; B60R 11/04; B60R 2011/0026; B60R 13/02
See application file for complete search history.

(56) References Cited

U.S. PATENT DOCUMENTS

| | | | |
|---|---|---|---|
| 9,641,807 B2 * | 5/2017 | Schuder | H04N 7/18 |
| 9,944,317 B2 * | 4/2018 | Lee | G06V 20/58 |

(Continued)

FOREIGN PATENT DOCUMENTS

JP    2019-137289 A    8/2019

*Primary Examiner* — Dalena Tran
(74) *Attorney, Agent, or Firm* — Paratus Law Group, PLLC

(57) ABSTRACT

An automatic driving vehicle, that is automatically movable, includes a front window, a LIDAR disposed at an inner side of the front window and configured to acquire external world information on an automatic movement, a display device disposed at the inner side of the front window, a cover member covering the LIDAR and the display device, and a blowout port configured to discharge air toward the LIDAR and the display device along the inner side of the front window. The cover member includes a first introduction port formed by a gap between a portion overlapping the LIDAR in a width direction of the moving body and the front window, and a second introduction port formed by a gap between a portion overlapping the display device in the width direction and the front window. The gap of the first introduction port is larger than the gap of the second introduction port.

8 Claims, 8 Drawing Sheets

(51) Int. Cl.
 *B60Q 1/50* (2006.01)
 *G05D 1/00* (2006.01)
 *B60R 11/00* (2006.01)

(56) References Cited

U.S. PATENT DOCUMENTS

2016/0034771 A1* 2/2016 Schamp .................... B60R 1/00
  348/148
2017/0083774 A1* 3/2017 Solar .................... G06V 20/588
2017/0361759 A1* 12/2017 Kim ....................... B60Q 1/085

* cited by examiner

MOVING BODY

CROSS-REFERENCE TO RELATED APPLICATIONS

The present application claims the benefit of priority of Japanese Patent Application No. 2020-143969, filed on Aug. 27, 2020, the content of which is incorporated herein by reference.

TECHNICAL FIELD

The present invention relates to a moving body such as an automatic driving vehicle, and more particularly to a moving body including an external world information acquisition device capable of acquiring external world information around a host vehicle.

BACKGROUND ART

In recent years, in order to realize an operation of a safe and comfortable vehicle while reducing a burden on a driver, there has been known an automatic driving vehicle in which an external world information acquisition device is mounted to acquire external world information on an automatic movement, and automatic driving is performed based on the external world information. Since the external world information acquisition device generates heat in accordance with the operation thereof, there is a concern that a temperature of devices constituting the external world information acquisition device may rise to a temperature equal to or higher than a use upper limit temperature, and a performance thereof may be affected. Therefore, it is important to appropriately cool the external world information acquisition device and maintain the performance thereof.

For example, JP-A-2019-137289 discloses a vehicle exterior monitoring device in which an image capturing module in which an image capturing element for capturing an image of a situation outside a vehicle is incorporated is covered with an image capturing cover and a reflection suppression member, a first opening portion of the image capturing cover and a second opening portion of the reflection suppression member are communicated with each other, and air blown from below a glass is blown to the glass in front of the image capturing element via the first opening portion and the second opening portion, thereby preventing the glass in front of a camera from fogging and accurately monitoring the situation outside the vehicle.

SUMMARY OF INVENTION

However, the vehicle exterior monitoring device of JP-A-2019-137289 is used for preventing fogging of the glass in front of the camera, and does not consider cooling of an external world information acquisition device. Furthermore, in a case where the external world information acquisition device extends in a width direction of the vehicle, there is no description of a method for taking in cooling air that can effectively cool each part of the external world information acquisition device, and there is room for improvement.

The present embodiment provides a moving body capable of appropriately cooling an external world information acquisition device.

The present embodiment provides a moving body that is automatically movable, the moving body comprising:

a transmission portion;

an external world information acquisition device disposed at an inner side of the transmission portion and configured to acquire external world information on an automatic movement;

a display device disposed at the inner side of the transmission portion;

a cover member covering the external world information acquisition device and the display device; and a blowout port configured to discharge air toward the external world information acquisition device and the display device along the inner side of the transmission portion, wherein the cover member includes an introduction port configured to introduce air discharged from the blowout port, wherein the introduction port includes a first introduction port formed by a gap between a portion overlapping the external world information acquisition device in a width direction of the moving body and the transmission portion, and a second introduction port formed by a gap between a portion overlapping the display device in the width direction and the transmission portion, and wherein the gap of the first introduction port is larger than the gap of the second introduction port.

According to the present embodiment, it is possible to actively take in cooling air into the external world information acquisition device, and it is possible to appropriately cool the external world information acquisition device.

DESCRIPTION OF EMBODIMENTS

Figure 1:
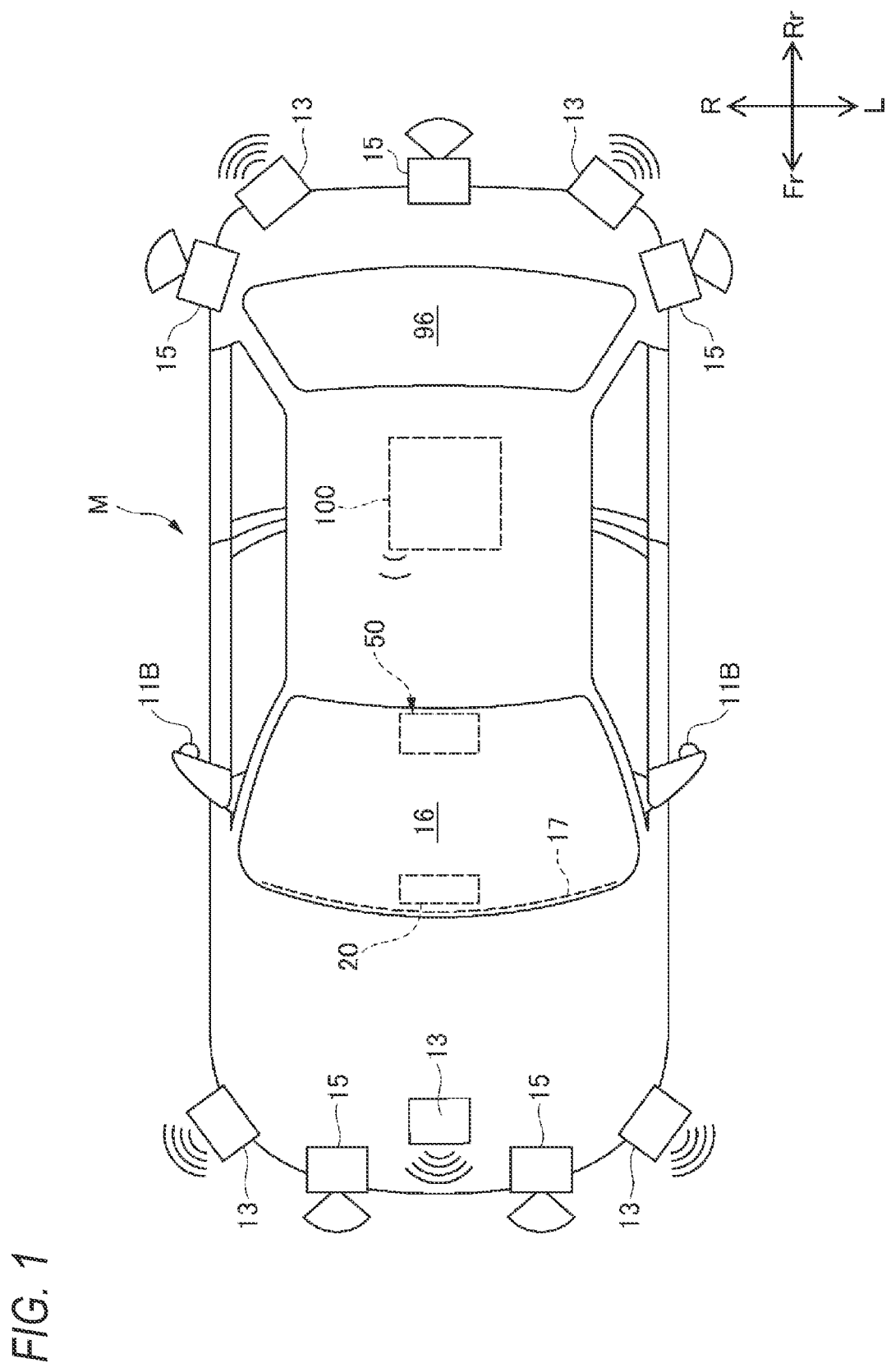
FIG. 1 is an overall configuration diagram of an automatic driving vehicle according to an embodiment of the present invention.

Hereinafter, an embodiment of a moving body (hereinafter, also referred to as an automatic driving vehicle) that is automatically movable according to the present embodiment will be described with reference to the accompanying drawings. In the following description, a left-right direction, a front-rear direction, and an upper-lower direction are defined and described with reference to a front side in a traveling direction of the automatic driving vehicle. In the drawings, a front side is indicated as Fr, a rear side as Rr, a right side as R, a left side as L, an upper side as U, and a lower side as D.

First, the automatic driving vehicle according to the present embodiment will be described with reference to FIGS. 1 and 2. As shown in FIG. 1, an automatic driving vehicle M according to the present embodiment is, for example, an automobile such as a two-wheeled vehicle, a three-wheeled vehicle, or a four-wheeled vehicle. The automatic driving vehicle M includes an automobile having an internal combustion engine such as a diesel engine or a gasoline engine as a power source, an electric automobile having an electric motor as a power source, a hybrid automobile having both an internal combustion engine and an electric motor, and the like. Among these automobiles, the electric automobile is driven by using electric power discharged from a battery such as a secondary battery, a hydrogen fuel battery, a metal fuel battery, or an alcohol fuel battery, for example.

As shown in FIG. 1, a plurality of vehicle exterior cameras 11, radars 13, and light detection and rangings 15 (LIDAR) are mounted around a body of the automatic driving vehicle M are mounted, and detect external world information on a target including an object or a sign present around the automatic driving vehicle M to realize automatic driving of the automatic driving vehicle M.

In a vehicle interior, a sensor unit 50 (the sensor unit 50 will be described in detail later) configured by combining a plurality of external world information acquisition devices, display devices, and the like, a navigation device 20 having a function of mapping the current position of the automatic driving vehicle M on a map and performing route guidance to a destination, and the like, and a vehicle control device 100 having a function of performing an autonomous traveling control of the automatic driving vehicle M including steering and acceleration/deceleration of the automatic driving vehicle M, and the like are mounted.

These devices and equipment are connected to each other so as to be able to perform data communicate with each other via a communication medium such as a controller area network (CAN). Note that the vehicle control device 100 may include various sensors, a human machine interface (HMI), and the like in addition to various control devices related to the autonomous traveling.

The vehicle exterior camera 11B provided on left and right door front portions and the like periodically and repeatedly capture images of states of a right rear side and a left rear side in the automatic driving vehicle M, and image information is transmitted to the vehicle control device 100 via the communication medium.

The radar 13 has a function of acquiring distribution information of a target including a distance to the target and an azimuth of the target by receiving a radar wave reflected by the target, while irradiating the target including a preceding vehicle, which is a target to be tracked, which travels in front of the automatic driving vehicle M with the radar wave. As the radar wave, a laser, a microwave, a millimeter wave, an ultrasonic wave, or the like may be appropriately used. In the present embodiment, as shown in FIG. 1, there are total five radars 13, three are provided on a front side and two are provided on a rear side. The distribution information of the target by the radar 13 is transmitted to the vehicle control device 100 via the communication medium.

The LIDAR 15 has a function of detecting the presence or absence of the target and the distance to the target by measuring time required to detect a scattered light with respect to an irradiation light, for example. In the present embodiment, as shown in FIG. 1, there are total six LIDARs 15 disposed around the automatic driving vehicle M, two are provided on the front side, one is provided inside the sensor unit 50, and three are provided on the rear side. The distribution information of the target by the LIDAR 15 is transmitted to the vehicle control device 100 via the communication medium.

The navigation device 20 includes a global navigation satellite system (GNSS) receiver, map information (navigation map), a touch panel type internal display device that functions as a human machine interface, a speaker, a microphone, and the like. The navigation device 20 calculates the current position of the automatic driving vehicle M by the GNSS receiver, and derives a route from the current position to a destination designated by the user.

The route derived by the navigation device 20 is provided to a target lane determination unit of the vehicle control device 100. When the vehicle control device 100 is set to a manual driving mode, the navigation device 20 guides the route to the destination by a voice or a map display.

Figure 2:
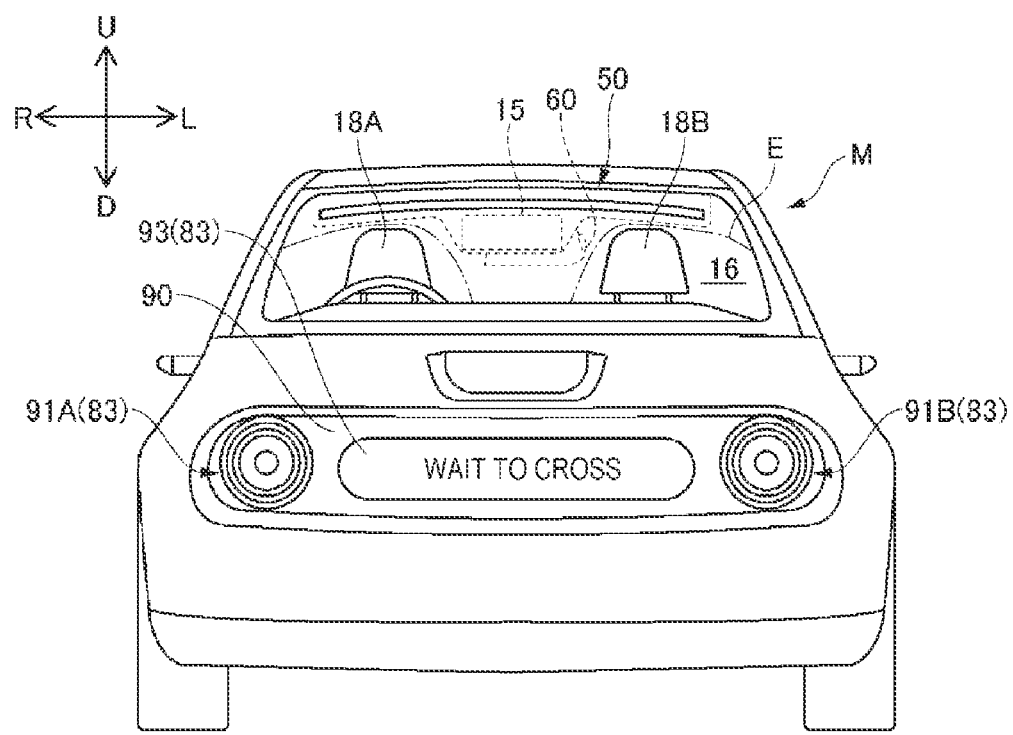
FIG. 2 is an external view showing a front structure of the automatic driving vehicle.

As shown in FIG. 2, the automatic driving vehicle M includes an external display device 83 that displays various information to traffic participants (including pedestrians, bicycles, motorcycles, other vehicles, and the like) present around the automatic driving vehicle M. The external display device 83 includes a right front light portion 91A and a left front light portion 91B that are provided so as to be spaced apart from each other in a vehicle width direction, and a front display portion 93 that is provided between the left and right front light portions 91A, 91B, of a front grille 90 in the automatic driving vehicle M.

In addition to the various equipment described above, a communication device, a vehicle sensor, the HMI, a traveling driving force output device, a steering device, and a brake device (not shown) are mounted on the automatic driving vehicle M, and perform data communication with the vehicle control device 100 via the communication medium. Further, when the automatic driving vehicle M is set to an automatic driving mode, the vehicle exterior cameras 11B, the radars 13, the LIDARs 15, the sensor unit 50 to be described later, and the like acquire external world information on an automatic movement and the automatic driving is performed.

Next, the sensor unit 50 mounted in the vehicle interior will be described in detail with reference to FIGS. 3 to 8. The automatic driving vehicle M includes the sensor unit 50 mounted in a vicinity of an upper portion of the front window 16, which is a transmission portion, in addition to the vehicle exterior camera 11B, the radar 13, and the LIDAR 15 mounted around a vehicle body of the automatic driving vehicle M.

As shown in FIGS. 3 and 5 to 7, the sensor unit 50 includes the LIDAR 15 that is an external world information acquisition device, which is disposed substantially at a center in the vehicle width direction including a center of the automatic driving vehicle M in the vehicle width direction, a camera 11A that is another external world information acquisition device disposed, above the LIDAR 15, in a space S between the front window 16 and a bracket 55 to be described later, display devices 52 that each include an LED or the like extending in the left-right direction along an inner surface of the front window 16 from the LIDAR 15, and the rearview mirror 60 that is another device. The rearview mirror 60 may be a rearview monitor that reflects an image of a rear camera that reflects the rear of the automatic driving vehicle M, or may be a rear view mirror. The LIDAR 15 is disposed in front of the rearview mirror 60.

The sensor unit 50 is disposed in an area excluding a deployment area E of a side airbag and an operation area of a sun visor 19 (see FIG. 5) indicated by a dash-dot line in FIG. 2. As a result, the sensor unit 50 does not interfere with the operations of the side airbag and the sun visor 19.

Figure 6:
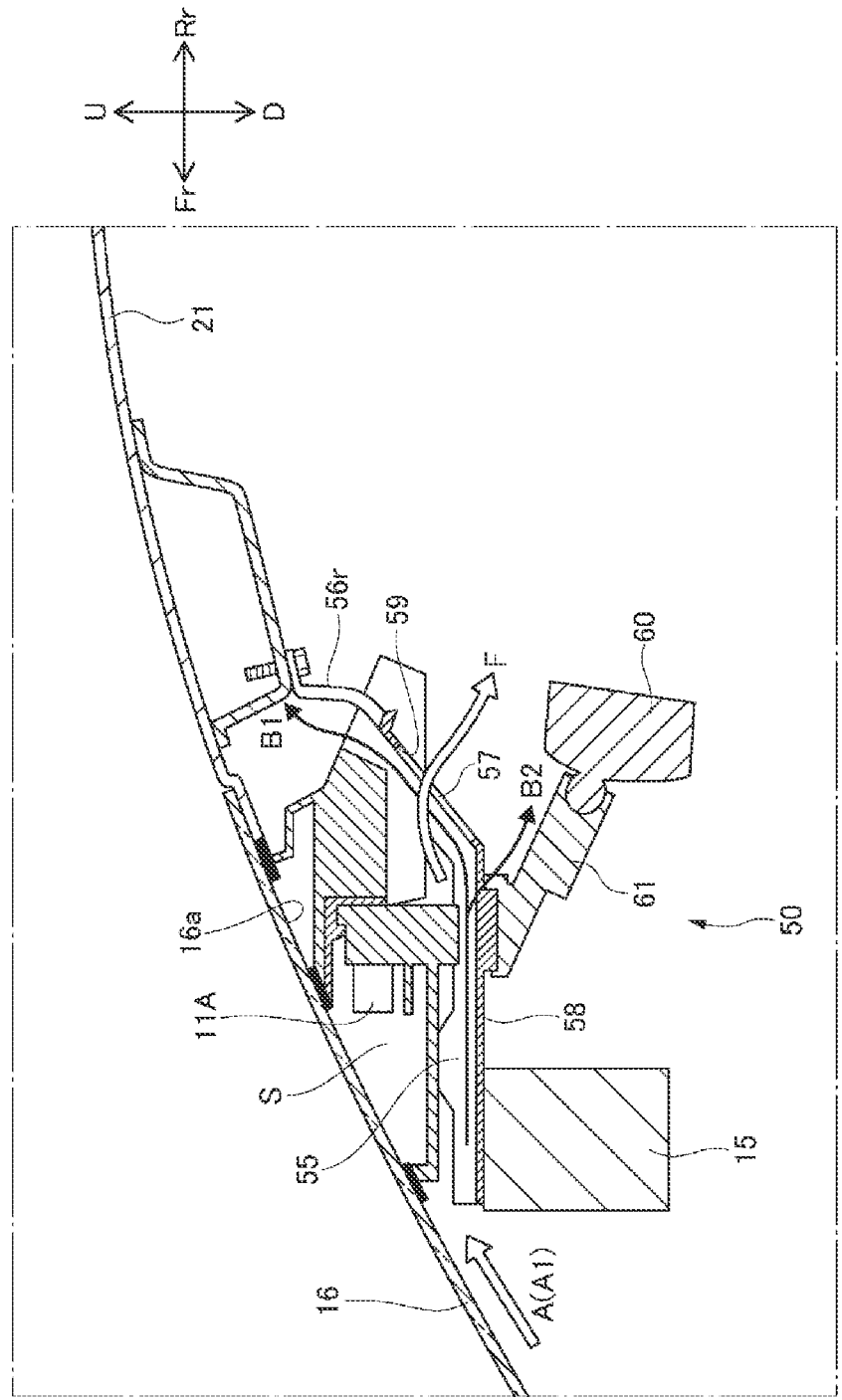
FIG. 6 is a sectional view showing a path along which heat of the LIDAR is transmitted to a moving body via the bracket.
Figure 7:
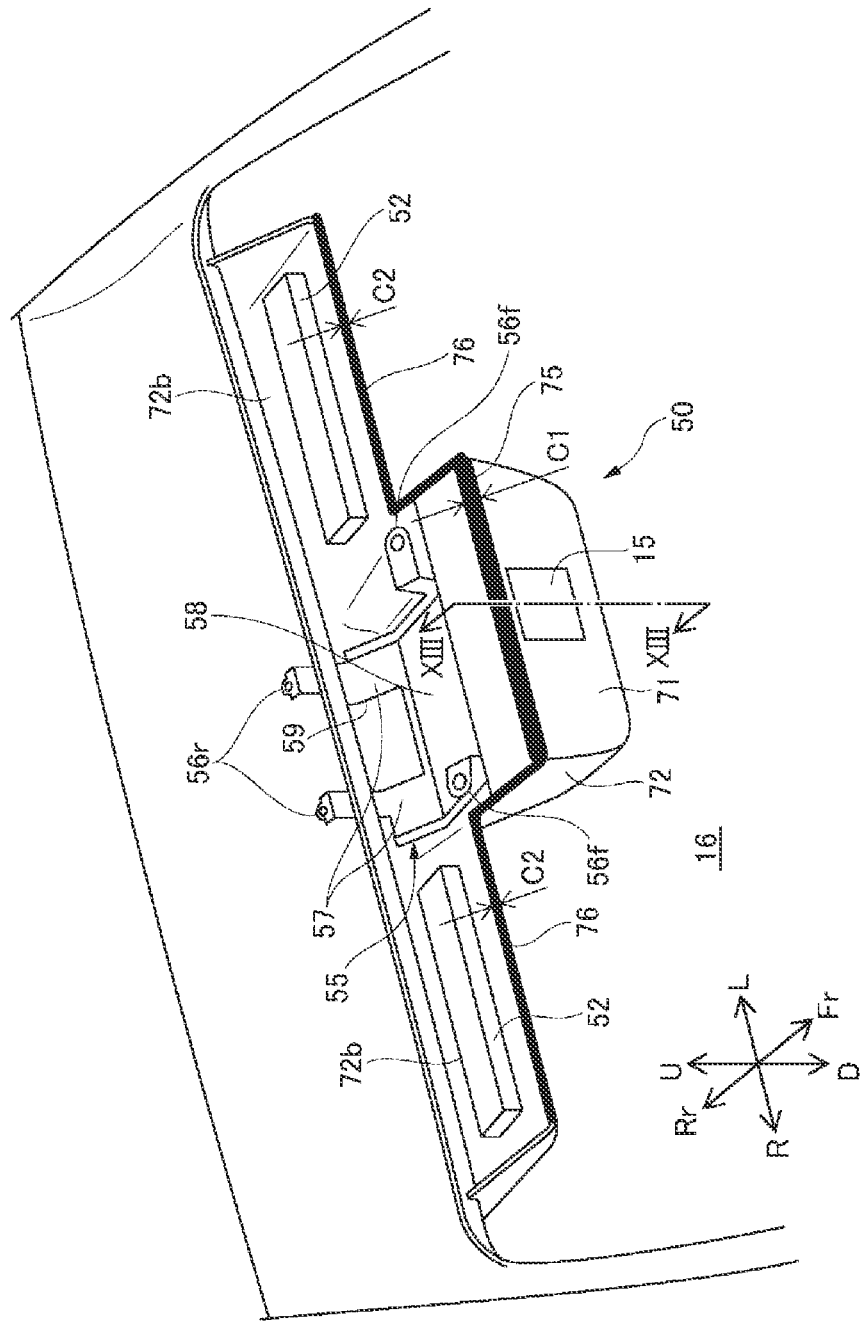
FIG. 7 is a perspective view showing a gap formed between the cover member and a front window.
Figure 8:
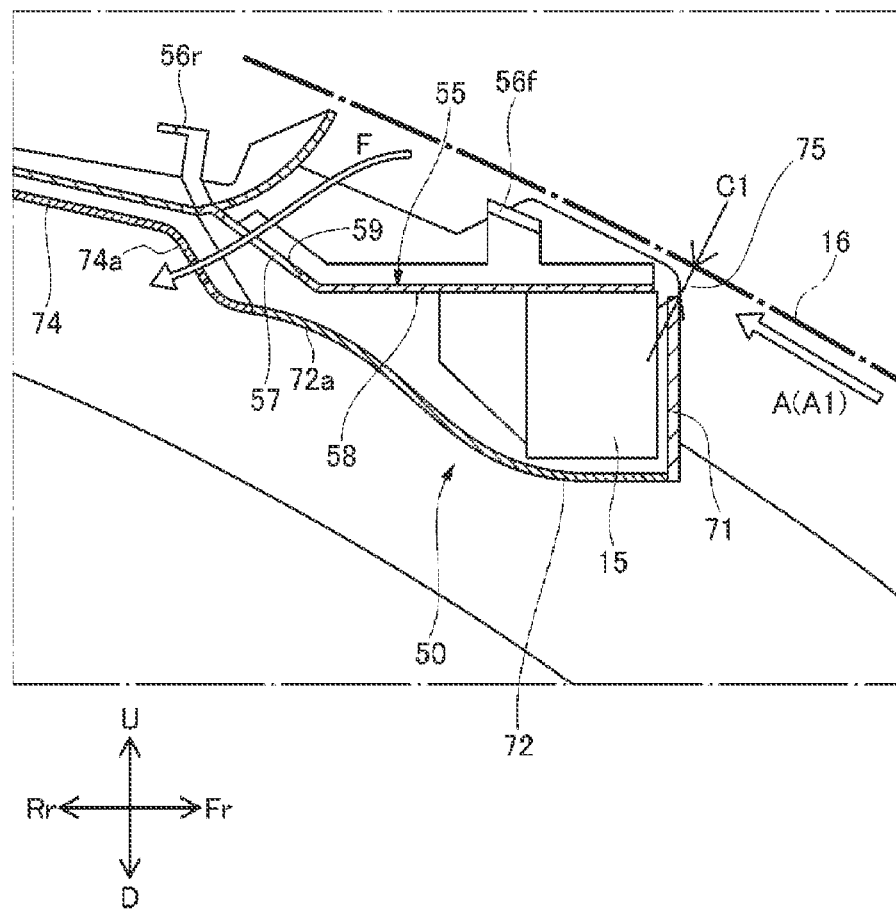
FIG. 8 is a sectional view taken along a line XIII-XIII in FIG. 7.

As shown in FIGS. 6 to 8, the LIDAR 15 and the rearview mirror 60 are attached to the bracket 55 fixed to a roof body 21 of the automatic driving vehicle M. The bracket 55 includes a pair of front arm portions 56f and a pair of rear arm portions 56r that are directly or indirectly fixed to the roof body 21, an inclined portion 57 that extends obliquely downward and forward from the pair of rear arm portions 56r toward the front window 16, and an attachment flat surface 58 that is formed by bending substantially horizontally from a front lower end of the inclined portion 57 and provided with the pair of front arm portions 56f on both sides. The bracket 55 is formed of a metal plate or the like having a high thermal conductivity, and is fixed to the roof body 21 at an angle intersecting a flow direction of air discharged from a blowout port 17 (see FIG. 1) of an air conditioner to be described later. In other words, the bracket 55 has a surface that receives the air discharged from the blowout port 17 (see FIG. 1) of the air conditioner in a state in which the bracket 55 is fixed to the roof body 21.

The LIDAR 15 is fixed to a lower surface of the attachment flat surface 58 of the bracket 55 at a front end portion on an upstream side in the flow direction of the air described above. In addition, a stay 61 of the rearview mirror 60, which is another device, is fixed to the attachment flat surface 58 so as to be obliquely downward and rearward. The rearview mirror 60 is disposed on a downstream side of the bracket 55 in the flow direction of the air described above. Note that the LIDAR 15 has already been described with reference to FIG. 1, and thus a description thereof will be omitted.

The space S between the bracket 55 and the front window 16 is provided with a camera module including the camera 11A and a lamp module including the display device 52.

The camera 11A of the present embodiment is a three-dimensional camera in which three monocular cameras are arranged side by side. The three-dimensional camera has an optical axis inclined obliquely downward in front of the host vehicle, and has a function of capturing an image of the traveling direction of the automatic driving vehicle M. As the camera 11A, for example, a complementary metal oxide semiconductor (CMOS) camera, a charge coupled device (CCD) camera, or the like may be appropriately used.

For example, the camera 11A periodically and repeatedly captures an image of a state in front of the automatic driving vehicle M in the traveling direction. The image information in front of the automatic driving vehicle M in the traveling direction captured by the camera 11A is transmitted to the vehicle control device 100 via the communication medium.

As shown in FIG. 7, a pair of display devices 52 are disposed on the left and right sides of the bracket 55 so as to extend in the vehicle width direction (left-right direction) along the front window 16. The display device 52 is located rearward of the LIDAR 15, and is disposed so that at least a part of the display device 52 is offset from the LIDAR 15 in the vehicle width direction. By disposing the LIDAR 15 further forward (closer to the front window 16), a detection accuracy of the LIDAR 15 is improved. The display device 52 notifies the surroundings that a content related to an operation state of the automatic driving vehicle M, for example, the automatic driving vehicle M is in the automatic driving by turning on a light when the automatic driving vehicle M is in the automatic driving mode, to a display unit 16a (see FIG. 3) of the front window 16.

Figure 3:
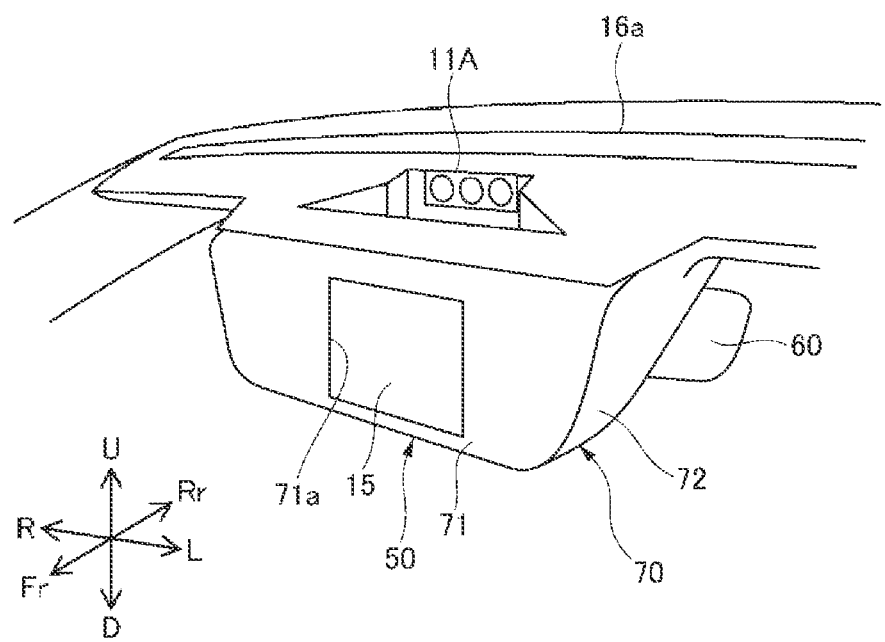
FIG. 3 is a perspective view of a sensor unit as viewed obliquely from left above.
Figure 5:
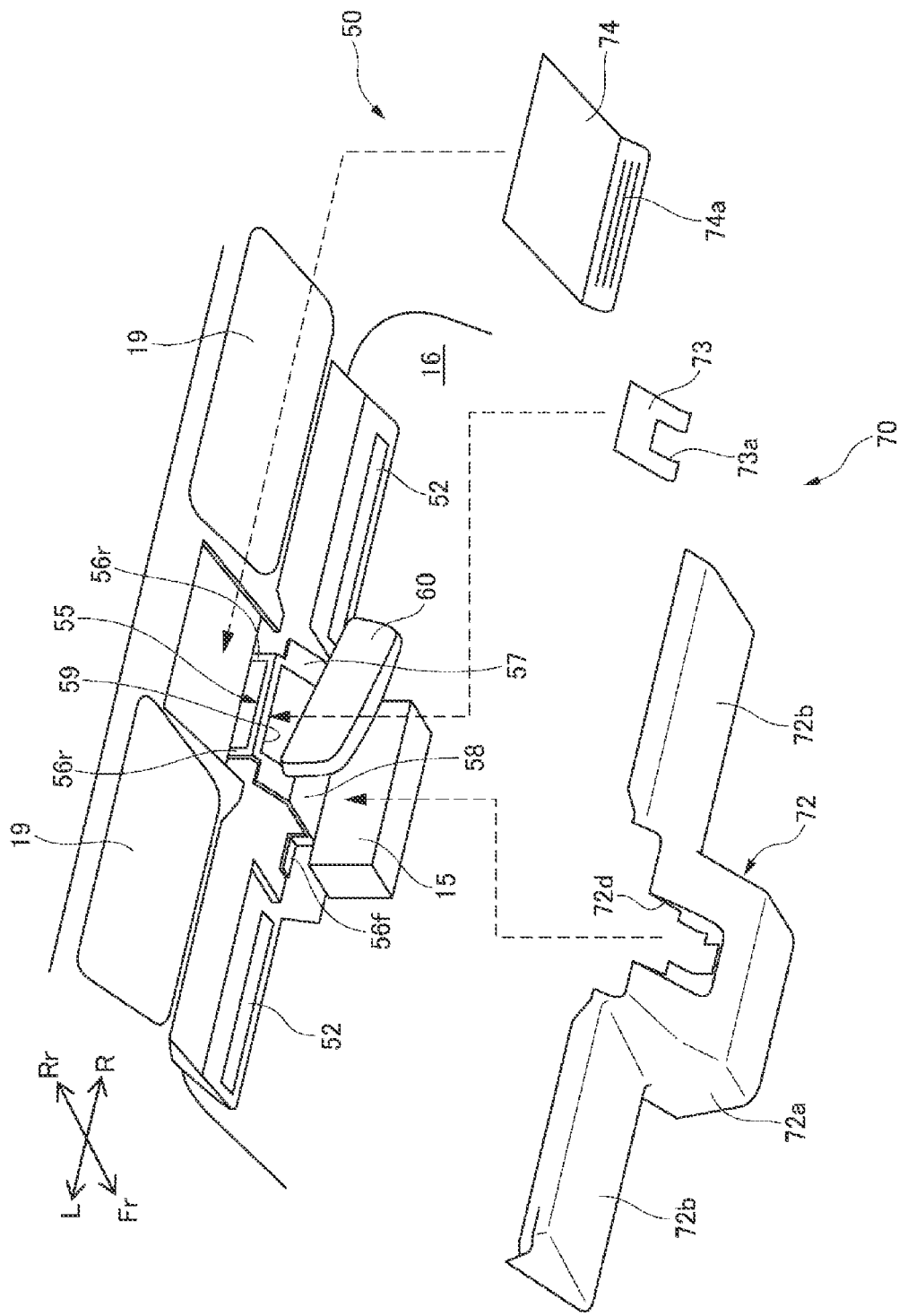
FIG. 5 is a perspective view in which a cover member is removed from a LIDAR and a rearview mirror fixed to a bracket.

As shown in FIGS. 3 and 5, the front and lower sides of the LIDAR 15, the camera 11A, and the display device 52 are covered with a cover member 70. The cover member 70 includes a front cover 71 that covers the front surface of the LIDAR 15, a lower cover 72 that covers lower portions of the LIDAR 15 and the display device 52, a lid cover 73 that covers a rear portion of the stay 61, and a roof cover 74 that covers the rear arm portions 56r and the inclined portions 57 of the bracket 55.

As shown in FIG. 3, the front cover 71 includes an opening portion 71a through which the LIDAR 15 is exposed, and covers the front surface of the LIDAR 15.

Figure 4:
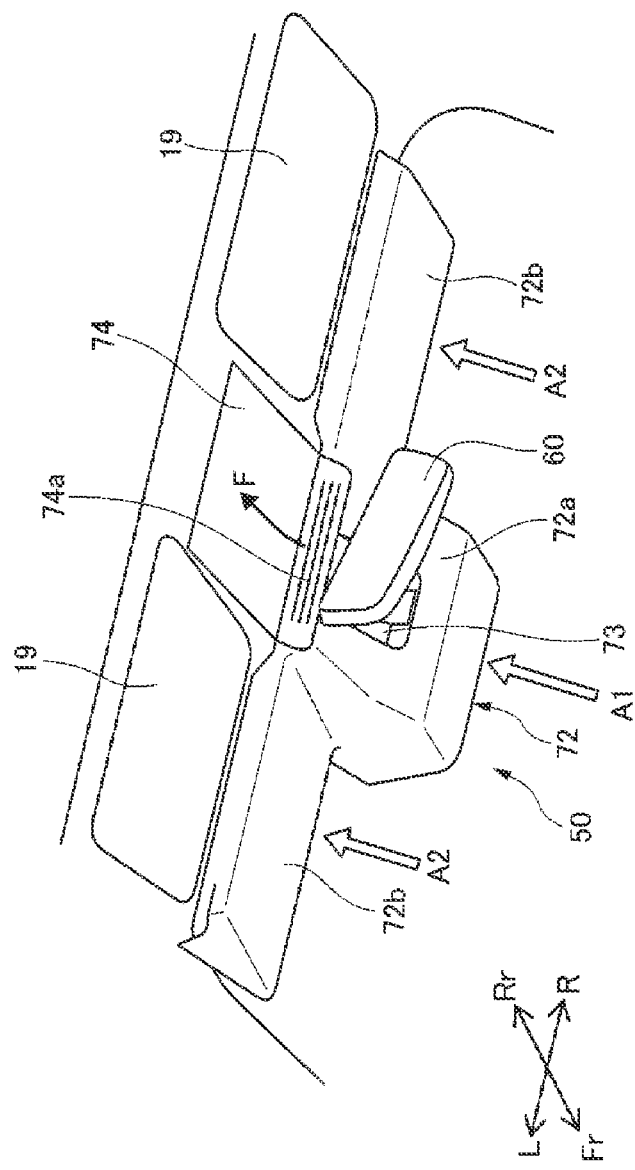
FIG. 4 is a perspective view of the sensor unit as viewed obliquely from left below.

As shown in FIG. 4, the lower cover 72 has a U-shaped groove 72d through which the stay 61 of the rearview mirror 60 penetrates, and includes a substantially rectangular parallelepiped LIDAR cover portion 72a that covers both side surfaces, a lower surface, and a part of a rear surface of the LIDAR 15, and display device cover portions 72b that are formed integrally with the LIDAR cover portion 72a, extend from the LIDAR cover portion 72a to both sides in the vehicle width direction and mainly covers a lower portion of the display device 52.

The lid cover 73 has a U-shaped groove 73a through which the stay 61 of the rearview mirror 60 penetrates, and covers a periphery of the stay 61, which is not covered by the LIDAR cover portion 72a. In addition, the roof cover 74 is disposed behind the LIDAR cover portion 72a and covers the rear arm portions 56r and the inclined portion 57 of the bracket 55. In the roof cover 74, a slit 74a, which is an air outlet port, is formed adjacent to a joint portion with the LIDAR cover portion 72a. The slit 74a is provided corresponding to the opening portion 59 formed in the inclined portion 57 of the bracket 55.

A height of the cover member 70 gradually decreases as the cover member 70 is separated rearward from the front window 16 in the front-rear direction. That is, the cover member 70 has a shape in which an internal space becomes gradually narrower toward the rear of the automatic driving vehicle M. As a result, the air can be guided in a direction away from the front window 16, and exhaust from the slit 74a is promoted. In addition, as shown in FIG. 2, the slit 74a is disposed at a position at which the slit 74a overlaps with, in the vehicle width direction, the LIDAR 15 including the center of the automatic driving vehicle M in the vehicle width direction, and is disposed between a plurality of seats 18A, 18B arranged in the vehicle width direction. As a result, the air discharged from the slit 74a into the vehicle interior is not directly led out toward occupants seated in the seats 18A, 18B, and there is no concern that comfort is impaired.

As shown in FIGS. 7 and 8, a first introduction port 75 and second introduction ports 76 that take in air discharged from the blowout port 17 of the air conditioner (not shown) (see FIG. 1) and flowing upward along the inner surface of the front window 16 (an arrow A in FIG. 6) are provided between a front end portion of the cover member 70 and the front window 16.

The first introduction port 75 is formed by a gap C1 between the front cover 71 overlapping with the LIDAR 15 in the vehicle width direction and the front window 16, and each of the second introduction ports 76 is formed by a gap C2 between the display device cover portion 72b overlapping the display device 52 in the vehicle width direction and the front window 16. The gap C1 of the first introduction port 75 is larger than each of the gaps C2 of the second introduction ports 76. As a result, more air is introduced into the LIDAR 15 that generates heat larger than the display device 52, so that the LIDAR 15 can be effectively cooled.

Next, a cooling effect of the sensor unit 50 will be described.

Since the LIDAR 15, the camera 11A, and the display device 52, which are components of the sensor unit 50, generate heat in accordance with the operations thereof, it is necessary to cool them. An amount of heat generated by the LIDAR 15 is larger than that of heat generated by the display device 52 and the rearview mirror 60. In particular, an area covered with the LIDAR cover portion 72a accommodating the LIDAR 15 tends to heat up and requires cooling.

As shown in FIG. 6, the heat of the LIDAR 15 is transmitted to the roof body 21 of the automatic driving vehicle M via the bracket 55 having a high thermal conductivity and is cooled, as indicated by an arrow B1 in the drawing. In addition, by using, as a heat capacity member, the rearview mirror 60 that is fixed to the bracket 55 and generates a less amount of heat than the LIDAR 15, the heat of the LIDAR 15 is transmitted to the rearview mirror 60 in a direction of an arrow B2, thereby further promoting the cooling of the LIDAR 15.

Since the bracket 55 is disposed in an air flow discharged from the blowout port 17, heat dissipation from the bracket 55 itself is also promoted. As a result, the LIDAR 15 can be appropriately cooled, and the automatic movement of the automatic driving vehicle M can be continued more stably. If a heat sink is disposed on the rearview mirror 60, the heat dissipation is further promoted.

More specifically, the air discharged from the blowout port 17 flows upward along the inner surface of the front window 16 as indicated by the arrow A in FIG. 6. A part of the air discharged from the blowout port 17 flows into the cover member 70 through the gap C1 between the front cover 71 and the front window 16, which is the first introduction port 75, as indicated by an arrow A1 in FIG. 4. Then, after the LIDAR 15 and the bracket 55 are mainly cooled, as shown by an arrow F in FIG. 4, the air is exhausted from the slit 74a of the roof cover 74 into the vehicle interior. Since the slit 74a is provided in a portion overlapping with the LIDAR 15 in the vehicle width direction, the LIDAR 15 is disposed between the first introduction port 75 and the slit 74a, so that the cooling of the LIDAR 15 can be further promoted.

Since the LIDAR 15 is disposed on the upstream side of the bracket 55 in the flow direction of the air, the LIDAR 15 itself can be cooled first, and the amount of heat transmitted from the LIDAR 15 to the bracket 55 can be reduced. Further, since the rearview mirror 60 is disposed on the downstream side of the bracket 55 in the flow direction of the air, the amount of heat transmitted to the rearview mirror 60 via the bracket 55 can be reduced.

A part of the air discharged from the blowout port 17 and flowing upward along the inner surface of the front window 16 flows into the cover member 70 from the gaps C2 between the display device cover portion 72b and the front window 16, which are the second introduction ports 76, as indicated by arrows A2 in FIG. 4. Then, after the display device 52 is mainly cooled, the air is exhausted from the slit 74a of the roof cover 74 into the vehicle interior.

At this time, since the gap C1 of the first introduction port 75 is set to be larger than each of the gaps C2 of the second introduction ports 76, more air can flow in from the first introduction port 75, and the LIDAR 15 that generates a large amount of heat can be effectively cooled. Accordingly, the automatic driving of the automatic driving vehicle M can be continued more stably. In addition, since the camera 11A is disposed above the bracket 55, the air flowing into the cover member 70 from the gap C1 of the first introduction port 75 can also cool the camera 11A. Since the camera 11A is located above the LIDAR 15 and on the downstream side of the air flowing upward along the inner surface of the front window 16, it is possible to suppress an influence of the heat of the camera 11A on the LIDAR 15.

Although various embodiments have been described above with reference to the drawings, it is needless to say that the present invention is not limited to such an example. It is apparent to those skilled in the art that various changes and modifications can be conceived within the scope of the claims, and it is also understood that the various changes and modifications belong to the technical scope of the present invention. In addition, constituent elements in the embodiment described above may be combined freely within a range not departing from the spirit of the present invention.

For example, a slit may be provided in the front cover 71 of the LIDAR 15, and the LIDAR 15 may be cooled by the air taken in from the slit in addition to the air flow from the first introduction port 75.

The number of seats arranged in the vehicle width direction of the automatic driving vehicle M is not limited to two, but is preferably an even number. In this case, the slit 74a is preferably arranged between half the number of seats.

In the present specification, at least the following matters are described. Although corresponding constituent elements or the like in the above embodiments are shown in parentheses, the present invention is not limited thereto.

(1) A moving body (automatic driving vehicle M) that is automatically movable, the moving body including:
  a transmission portion (front window 16);
  an external world information acquisition device (LIDAR 15) disposed at an inner side of the transmission portion and configured to acquire external world information on an automatic movement;
  a display device (display device 52) disposed at the inner side of the transmission portion;
  a cover member (cover member 70) covering the external world information acquisition device and the display device; and
  a blowout port (blowout port 17) configured to discharge air toward the external world information acquisition device and the display device along the inner side of the transmission portion,
  wherein the cover member includes an introduction port (first introduction port 75, second introduction port 76) configured to introduce air discharged from the blowout port,
  wherein the introduction port includes
    a first introduction port (first introduction port 75) formed by a gap (gap C1) between a portion overlapping the external world information acquisition device in a width direction of the moving body and the transmission portion, and
    a second introduction port (second introduction port 76) formed by a gap (gap C2) between a portion overlapping the display device in the width direction and the transmission portion, and
  wherein the gap of the first introduction port is larger than the gap of the second introduction port.

According to (1), since the gap of the first introduction port is larger than the gap of the second introduction port, the air flows actively to the external world information acquisition device that acquires the external world information on the automatic movement of the moving body. Accordingly, cooling of the external world information acquisition device can be promoted, and the external world information acquisition device can be appropriately cooled.

(2) The moving body according to (1),
wherein the cover member further includes an outlet port (slit 74*a*) through which air inside the cover member is led out, and
wherein the outlet port is provided at a portion at which the outlet port overlaps with the external world information acquisition device in the width direction.

According to (2), since the outlet port for discharging the air inside the cover member is provided at the portion at which the outlet port overlaps with the external world information acquisition device in the width direction, the external world information acquisition device is disposed between the first introduction port and the outlet port. Therefore, the cooling of the external world information acquisition device can be further promoted.

(3) The moving body according to (2),
wherein an even number of seats (seats 18A, 18B) are provided in the width direction, and
wherein the outlet port is disposed between the even half number of seats in the width direction.

According to (3), since the air entering an inner side of the cover member is led out toward a space between the seats arranged in the width direction, the air after the heat exchange is not led out to an occupant in the seat, and comfort of the moving body can be improved.

(4) The moving body according to any one of (1) to (3),
wherein the external world information acquisition device is disposed at a position including a center of the moving body in the width direction.

According to (4), since the external world information acquisition device is disposed at a position including the center of the moving body in the width direction, a detection accuracy of a sensor is improved.

(5) The moving body according to any one of (1) to (4),
wherein an amount of heat generated by the external world information acquisition device is larger than an amount of heat generated by the display device.

According to (5), the external world information acquisition device having a larger amount of heat generation can be actively cooled.

(6) The moving body according to any one of (1) to (5),
wherein the external world information acquisition device is disposed outside a deployment range of an airbag.

According to (6), since the external world information acquisition device is disposed outside the deployment range of the airbag, an influence of the airbag can be avoided even when the airbag is activated.

(7) The moving body according to any one of (1) to (6),
wherein the cover member is configured such that a height thereof decreases as the cover member moves away from the transmission portion in a front-rear direction.

According to (7), since an internal space of the cover member is narrowed as the cover member moves away from the transmission portion, the air can be guided in a direction away from the transmission portion, and the cooling of the external world information acquisition device is promoted.

(8) The moving body according to any one of (1) to (7),
wherein the display device displays a content related to the automatic movement.

According to (8), the display device displays the content related to the automatic movement, so that it is possible to notify surrounding vehicles and a person of the content related to the automatic movement.

What is claimed is:

1. A moving body that is automatically movable, the moving body comprising:
   a transmission portion;
   an external world information acquisition device disposed at an inner side of the transmission portion and configured to acquire external world information on an automatic movement;
   a display device disposed at the inner side of the transmission portion;
   a cover member covering the external world information acquisition device and the display device; and
   a blowout port configured to discharge air toward the external world information acquisition device and the display device along the inner side of the transmission portion,
   wherein the cover member includes an introduction port configured to introduce air discharged from the blowout port,
   wherein the introduction port includes
      a first introduction port formed by a gap between a portion overlapping the external world information acquisition device in a width direction of the moving body and the transmission portion, and
      a second introduction port formed by a gap between a portion overlapping the display device in the width direction and the transmission portion, and
   wherein the gap of the first introduction port is larger than the gap of the second introduction port.

2. The moving body according to claim 1,
   wherein the cover member further includes an outlet port through which air inside the cover member is led out, and
   wherein the outlet port is provided al a portion at which the outlet port overlaps with the external world information acquisition device in the width direction.

3. The moving body according to claim 2,
   wherein an even number of seats are provided in the width direction, and
   wherein the outlet port is disposed between the even half number of seats in the width direction.

4. The moving body according to claim 1,
   wherein the external world information acquisition device is disposed at a position including a center of the moving body in the width direction.

5. The moving body according to claim 1,
   wherein an amount of heat generated by the external world information acquisition device is larger than an amount of heat generated by the display device.

6. The moving body according to claim 1,
   wherein the external world information acquisition device is disposed outside a deployment range of an airbag.

7. The moving body according to claim 1,
   wherein the cover member is configured such that a height thereof decreases as the cover member moves away from the transmission portion in a front-rear direction.

8. The moving body according to claim 1,
   wherein the display device displays a content related to the automatic movement.

* * * * *